United States Patent
Apte et al.

(10) Patent No.: US 11,675,960 B2
(45) Date of Patent: Jun. 13, 2023

(54) MACHINE LEARNING BASED LAYOUT NUDGING FOR DESIGN RULE COMPLIANCE

(71) Applicant: X Development LLC, Mountain View, CA (US)

(72) Inventors: Raj Apte, Palo Alto, CA (US); Cyrus Behroozi, Menlo Park, CA (US); Kathryn Heal, Santa Rosa, CA (US); Owen Lewis, Standord, CA (US); Zhigang Pan, Austin, TX (US); Dino Ruic, Santa Clara, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 17/516,476

(22) Filed: Nov. 1, 2021

(65) Prior Publication Data

US 2023/0138706 A1 May 4, 2023

(51) Int. Cl.
*G06F 30/398* (2020.01)
*G06F 30/323* (2020.01)
*G06F 30/27* (2020.01)

(52) U.S. Cl.
CPC ............ *G06F 30/398* (2020.01); *G06F 30/27* (2020.01); *G06F 30/323* (2020.01)

(58) Field of Classification Search
CPC ..................................................... G06F 30/398
USPC ......................................................... 716/112
See application file for complete search history.

(56) References Cited

U.S. PATENT DOCUMENTS

| | | | |
|---|---|---|---|
| 10,706,200 B2 | 7/2020 | Sha et al. | |
| 10,755,026 B1* | 8/2020 | Luo | G06F 30/27 |
| 10,943,049 B2 | 3/2021 | Chuang et al. | |
| 2018/0107781 A1* | 4/2018 | Berkens | G06F 30/398 |
| 2020/0104457 A1* | 4/2020 | Chuang | G06F 30/327 |
| 2021/0049315 A1* | 2/2021 | Liao | H01L 24/19 |
| 2021/0097224 A1* | 4/2021 | Lin | G06F 30/398 |
| 2021/0174000 A1* | 6/2021 | Chuang | G06F 30/392 |
| 2022/0164515 A1* | 5/2022 | Huang | G06F 30/398 |

OTHER PUBLICATIONS

Francisco et al., Design Rule Checking with a CNN Based Feature Extractor, University of North Carolina, 2020.
(Continued)

*Primary Examiner* — Suchin Parihar
(74) *Attorney, Agent, or Firm* — Christensen O'Connor Johnson Kindness PLLC

(57) ABSTRACT

Embodiments of a system and method for generating integrated circuit layouts are described herein. A computer implemented method for generating integrated circuit layouts includes receiving a first layout for an integrated circuit, segmenting the first layout into a plurality of different patches, each patch of the plurality of patches describing a discrete portion of the first layout, identifying a non-compliant patch of the plurality of patches, the non-compliant patch violating a design rule governing the manufacture of the integrated circuit, generating a transformation of the non-compliant patch using a machine learning model, and generating a second layout using the transformation and the first layout, where the second layout is compliant with the design rule.

20 Claims, 6 Drawing Sheets

(56) References Cited

OTHER PUBLICATIONS

Francisco, Machine Learning for Design Rule Checking, Multilayer CMP Hotspot Detection, and PPA Modeling, with Transfer Learning and Synthetic Training, University of North Carolina, 2021.
Catapult High-Level Synthesis and Verification, Siemens, 2021.
Digital transformation: How Siemens EDA helps you engineer a smarter future faster, Siemens Digital Industries Software, White Paper, 2021.
Tabrizi et al., Eh? Predictor: A Deep Learning Framework to Identify Detailed Routing Short Violates from a Placed Netlist, IEEE Transactions on Computer-Aided Design of Integrated Circuits and Systems, vol. 39, No. 6, Jun. 2020.
International Search Report and Written Opinion, dated Dec. 22, 2022, in corresponding International Patent Application No. PCT/US2022/042019, 10 pages.

* cited by examiner

MACHINE LEARNING BASED LAYOUT NUDGING FOR DESIGN RULE COMPLIANCE

TECHNICAL FIELD

This disclosure relates generally to integrated circuit design, and in particular but not exclusively relates to techniques for generating functionally consistent and manufacturable integrated circuit layouts in compliance with vendor process node design rules.

BACKGROUND INFORMATION

A contemporary integrated circuit layout includes multiple physical or material layers. Each layer is represented in the layout as a binary mask. The mask indicates positions where photoresist materials will be exposed during wafer fabrication. In this way, masks describe the presence or absence of a material in a semiconductor integrated circuit. Fabrication of integrated circuits typically includes multiple deposition and removal steps, each of which may be described by one or more binary masks. The overall layout describes positions of conductive, semiconducting, and insulating materials deposited in semiconductor layers and may be precise on the order of nanometers. As such, fabrication errors may impair the function of the integrated circuit and may impact the yield of a fabrication process.

Each semiconductor manufacturing system imposes constraints on integrated circuit layouts, arising out of variability in manufacturing processes and the need for integrated circuits to function as designed. To be manufacturable on a given system, referred to as a "vendor process node," a layout must comply with design rules that are specific to that system. The design rules encode the constraints imposed by the process node, for example, as logic that can be automated in software (referred to as "electronic design automation" and "design rule checking"). In an illustrative example, an integrated circuit layout may be limited by the resolution of an optical lithography process that forms nano-scale geometries of the physical integrated circuit.

Machine learning models are trained in various ways, including by supervised learning using labeled training sets. Integrated circuit design represents a challenge for development of machine learning models, due to the integral involvement of human expertise in the design process and due to access restrictions on proprietary optical lithography system data underlying design rules. As a result, training data is limited to publicly available compliant layouts, for example, for unsupervised methods to train classifier models. In some cases, a limited dataset of labeled compliant and non-compliant layouts is made available by semiconductor manufacturers, enabling supervised learning techniques. There is a need, therefore, for techniques to train and deploy machine learning models to identify non-compliant integrated circuit layouts and to generate compliant layouts that preserve circuit functionality.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
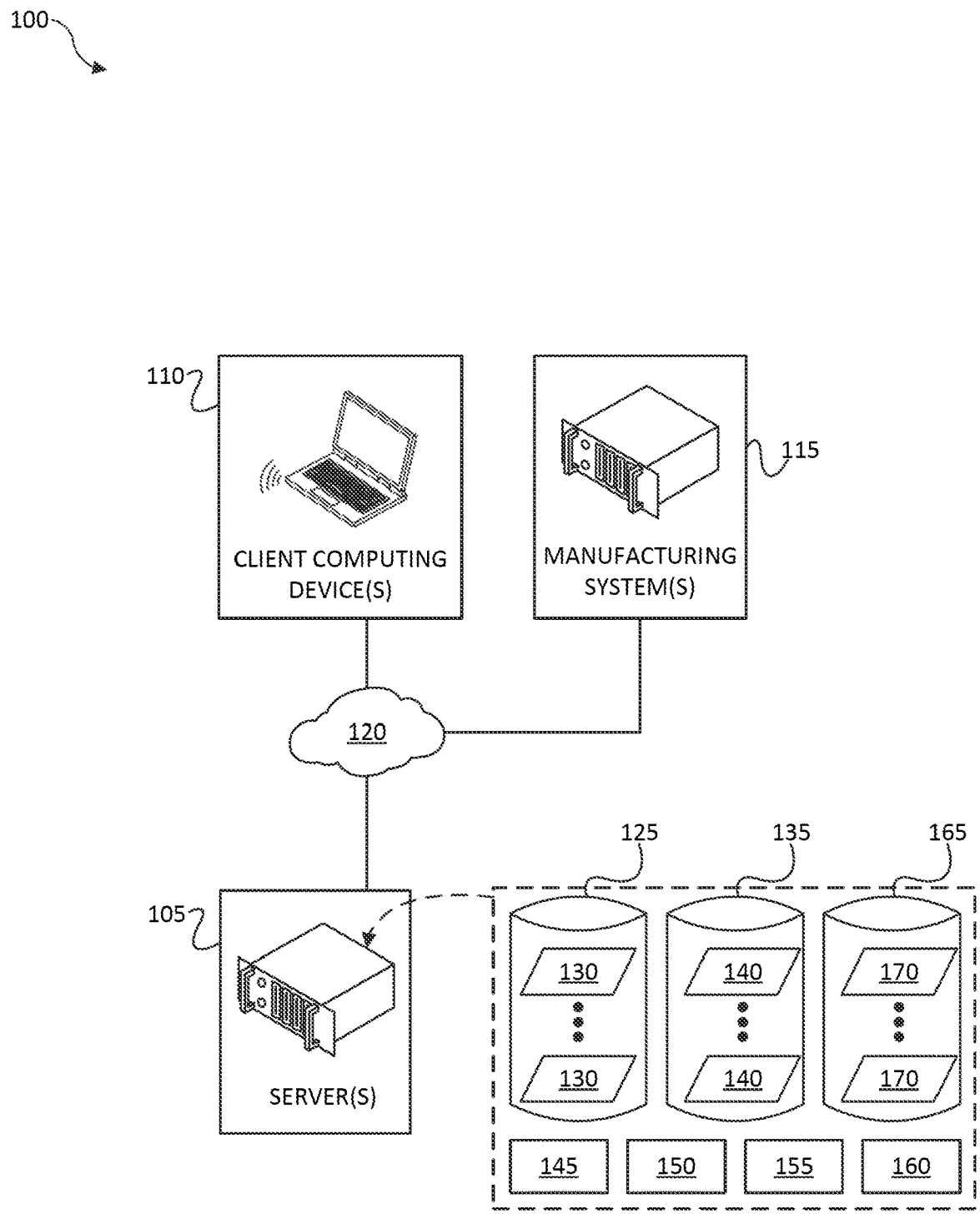
FIG. 1 is a schematic diagram of an example system for generating functionally consistent and manufacturable integrated circuit layouts in compliance with semiconductor manufacturing system design rules, in accordance with embodiments of the disclosure.

Embodiments of a system and method for generating functionally consistent and manufacturable integrated circuit layouts in compliance with semiconductor manufacturing system design rules using machine learning models are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Each vendor process node imposes constraints on integrated circuit layouts, arising out of variability, resolution limitations, and wafer limitations in manufacturing processes and the need for integrated circuits to function as designed. To be manufacturable on a given system, a layout must comply with design constraints that are specific to that system. Design rules encode the constraints imposed on in the manufacturing process, for example, as logic that can be automated in software (referred to as "electronic design automation" and "design rule checking"). In an illustrative example, an integrated circuit layout may be limited by the resolution of an optical lithography process that forms nano-scale geometries of the physical integrated circuit.

Characteristic dimensions of integrated circuit layout features progressively shrink in scale, proceeding from the 22 nm process node in 2012, to the 14 nm process node in 2014, to the 10 nm process node in 2017, with single-nanometer and sub-nanometer process nodes in development. Each advancement is accompanied by added complexity, such as multi-layer layouts, interlayer structures, vertical features, and dimensions approaching physical limits of deposition system operating windows. Consequently, design rules are becoming increasingly more difficult to understand for human designers, as the number and complexity of design constraints increases.

Typical approaches to design rule checking and modification of circuit layouts rely on expertise of human designers coupled with fixed algorithms for identifying second layout features. Such approaches become impractical when the level of interaction between design constraints results in highly coupled design rules. An alternative approach is presented by training machine learning models on design rules. Machine learning models, such as artificial neural networks, are well suited to systems with many inter-related parameters, but integrated circuit design represents a challenge for development of machine learning models, due to the integral involvement of human expertise in the design process and due to access restrictions on proprietary optical lithography system data underlying design rules. There is a need, therefore, for techniques to train and deploy machine learning models to identify non-compliant integrated circuit layouts, generate one or more variations of the second layouts that are manufacturable, and to correct layouts with or without human supervision to generate compliant layouts that preserve circuit functionality of initial layouts.

Embodiments of a system and method for generating functionally consistent and manufacturable integrated circuit layouts include approaches for generating training sets of labeled data using sparse datasets of compliant layout files, termed "perturbation" of the compliant layouts, training artificial neural networks using the training sets, and deploying trained machine learning models to identify design rule violations and to generate transformations of non-compliant "first" layouts to generate compliant "second" layouts. In an illustrative example, a first layout for an integrated circuit is submitted to a computer system for validation, for example, by a human designer. The computer system segments the first layout into discrete patches, validating each patch against design rules. Non-compliant patches are processed, and the system generates transformations for non-compliant patches using a machine learning model that is trained on a particular set of design rules. Transformations are applied to the first layout to output a second layout compliant with the design rules.

The techniques described herein may follow additional design optimization, in that transformations may be small enough to maintain functional consistency with performance characteristics of first layouts. In some cases, however, machine-learning methods applied to generate transformations and/or second layouts can be repeated during the optimization process, for example, iterating each time a number of optimization updates have completed. Machine learning methods can also be supplemented with physical or functional simulation to improve functional consistency, as an approach to preserving integrated circuit performance.

Advantageously, the techniques described herein improve design rule checking of integrated circuit layouts, at least in part by incorporating one or more specific data preparation approaches for generating labeled training sets where labeled data is otherwise unavailable. Furthermore, machine learning models, in contrast to fixed-algorithm techniques, can be retrained as new training data are prepared. As such, the systems and methods described represent an adaptive tool that can be developed for an arbitrary semiconductor manufacturing process, from which only sparse data is available, which represents a substantial improvement in performance, robustness, and computational and human resource demand of integrated circuit design.

FIG. 1 is a schematic diagram of an example system 100 for generating functionally consistent and manufacturable integrated circuit layouts in compliance with semiconductor manufacturing system design rules, in accordance with embodiments of the disclosure. Example system 100 includes: one or more servers 105, one or more client computing devices 110, one or more semiconductor manufacturing systems 115, and a network 120. The server(s) 105 include: a first database 125 of training data 130, a second database 135 of design rules 140, one or more trained machine learning models 145 and one or more untrained machine learning models 150 encoded in software 155. As part of software 155, server(s) 105 include instructions by which the models 145-150 are trained and/or deployed using computer circuitry 160. In some embodiments, server(s) 105 further include a third database 165 storing layout files 170, also referred to as integrated circuit layout files, which may be stored in one or more database file formats including but not limited to GDSII, or OASIS.

The following description focuses on embodiments of the present disclosure implementing a networked system for training and/or deploying machine learning models 145-150 as part of a system for generating design rule 140 compliant integrated circuit layouts. It is contemplated, however, that some embodiments of the present disclosure include some or all of the processes being implemented on client computing device(s) 110, such as a laptop or personal computer. For example, the training of untrained model 150 may be implemented using server(s) 105, while trained model 145 may be transferred to client computing device 110 via network 120 and may be deployed directly on client computing device 110. Similarly, the constituent elements of example system 100 may be hosted and/or stored on a distributed computing system (e.g., a cloud system) rather than in a unitary system. For example, first database 125, second database 135, third database 165, and/or computer circuitry 160 may be implemented across a distributed system, such that portions of training data 130, design rules 140, software 155, and/or layout files 170 may be stored or executed by a distributed computing system in one or more physical locations.

In an illustrative example of the operation of example system 100, a user of client computing device 110 prepares a layout 210 (in reference to FIG. 2) describing an integrated circuit to be manufactured using manufacturing system 115. Layout 210 is examined using automated design rule checking software that may be stored and/or hosted on client computing device 110. Additionally or alternatively, layout 210 may be transferred to server(s) 105 via network 120, where a design rule checking engine is hosted and/or stored on server(s) 105. Where layout 210 complies with design rules 140 corresponding to manufacturing system 115, layout 210 may be transferred to manufacturing system 115 for use in manufacturing a physical integrated circuit, for example, on a wafer-scale semiconductor manufacturing process.

Manufacturing system 115 is an example of complex systems in a pipeline between layout design and semiconductor foundries that process integrated circuit layouts and convert the layout data into mask data. Mask data, in turn, is used to generate photomasks used in a photolithographic process of physical semiconductor device fabrication. In the context of example system 100, manufacturing system(s) 115 are represented by a network interface computer (e.g., a server), to simplify visual explanation. Typically, multiple processes (e.g., inverse lithography, optical proximity correction, process correction codes) are completed between "tapeout," which refers to the point at which a design rule 140 second layout for the integrated circuit is sent to the foundry, and fabrication of a compliant integrated circuit on a wafer.

Where layout 210 violates design rules 140, however, layout 210 cannot be manufactured. Instead, software 155 implementing trained model(s) 145 in a way that generates a transformed layout 235 and preserves the functionality of layout 210. Transformed layout 235 is then outputted. Outputting may include, but is not limited to, transfer to manufacturing system(s) 115 via network 120 and/or storing transformed layout 235 in third database 165 as a layout file 170. In some embodiments, transformed layout 235 is transmitted to manufacturing system(s) 115 and used to manufacture a semiconductor wafer. In some embodiments, both first layouts 210 and second layouts 235 are stored in third database 165 as layout files 170.

In some embodiments, however, updated design rules 140 and/or new design rules 140 are received from manufacturing system(s) 115, for example, where an untrained model 150 is to be trained for a new manufacturing system 115 for which a trained model 145 is not yet available. Also, semiconductor processing technology is regularly improved as new devices and techniques are developed, so it is contemplated that example system 100 will support retraining of trained models 145 and preparing new models 145-150 with changes to design rules 140.

As described in more detail in the forthcoming paragraphs, trained model 145 generates transformed layout 235 by processing layout 210 and generating a global transformation describing one or more transformations applied to layout 210 to bring it into compliance with design rules 140. Once generated, layout 210 and transformed layout 235 may be stored as training data 130 and/or may be transferred to other constituent elements of example system 100.

Figure 2:
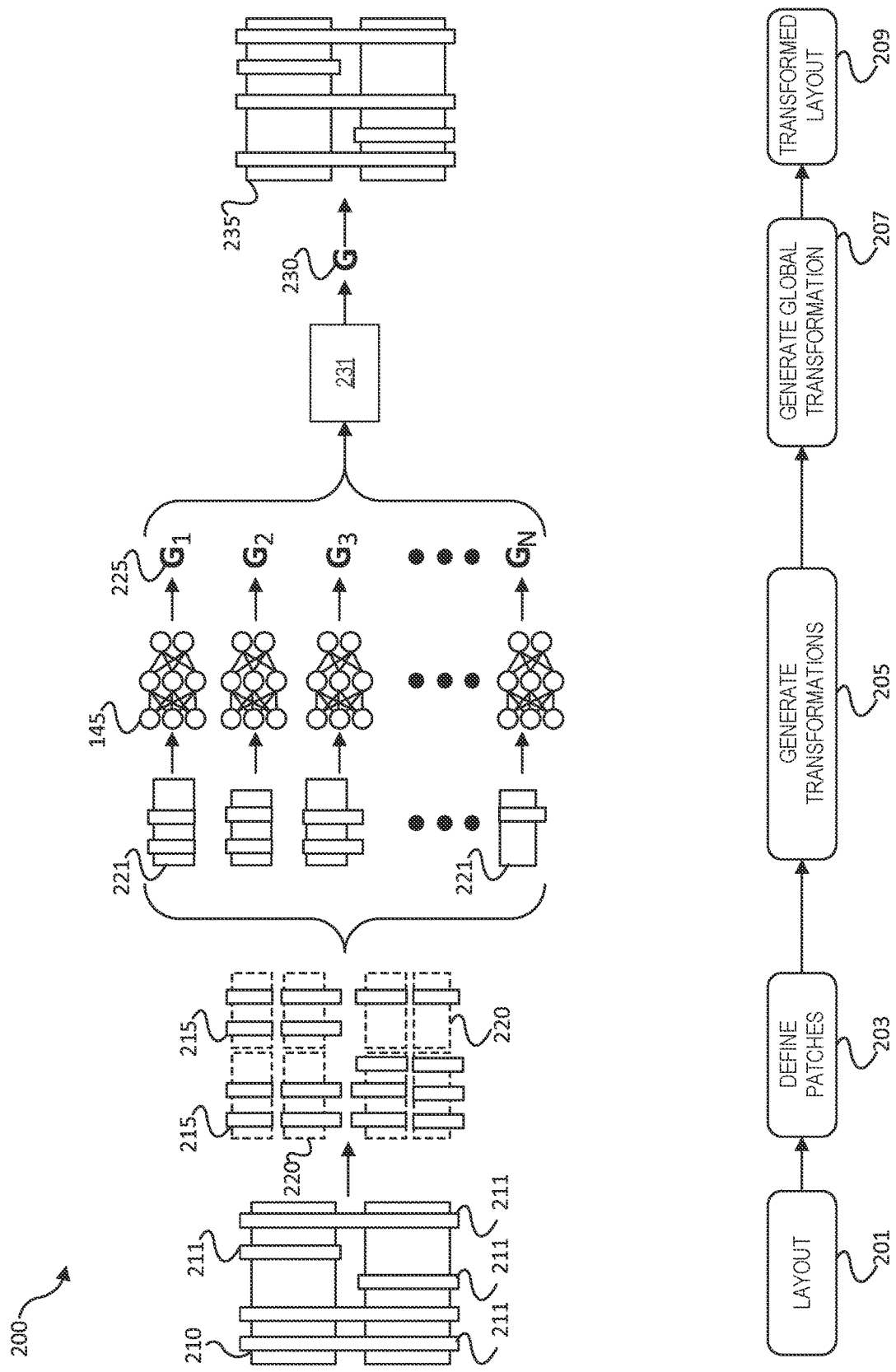
FIG. 2 is a schematic diagram illustrating an example process for generating a compliant second layout of an integrated circuit from a first layout using a machine learning model, in accordance with embodiments of the disclosure.

FIG. 2 is a schematic diagram illustrating an example process 200 for generating a transformed layout 235 of an integrated circuit from a layout 210 using a machine learning model, in accordance with embodiments of the disclosure. Example process 200 may be implemented by one or more constituent elements of example system 100 of FIG. 1, including but not limited to server(s) 105 and/or client computing device(s) 110. Example process 200 includes operations 201-209 for accessing and/or receiving the layout 210, defining patches 215, generating one or more transformations 225, generating an output coordinate vector 230, and generating a transformed layout 235.

Example process 200 is illustrated as a series of operations 201-209 implemented by a computer system, but it is understood that one or more of the operations 201-209 may be omitted, reordered, or divided. For example, in some embodiments, operations 201-203 are implemented by client computing device(s) 110 while operations 205-209 are implemented by server(s) 105. In some embodiments, example process 200 can be implemented as part of an interactive design environment, whereby a human user of the computer system can be presented with transformations to layouts during development of layout 210. The interactive design environment can be implemented as part of a user interface, such as an application hosted on client computing device(s) 110 or server(s) 105, that presents outputs of trained models 145 on a display, a terminal, or through other electronic devices. Example process 200 can be integrated with existing design software to provide correction functionality, thereby improving the performance of software used for designing integrated circuit layouts.

At operation 201, the computer system receives and/or accesses layout 210. As illustrated, layout 210 represents an integrated circuit in terms of planar geometric shapes, referred to as polygons 211, which describe photoresist patterns corresponding to processing of metal, oxide, dielectric, or semiconductor layers that make up the material components of the physical integrated circuit. Layout 210 is a binary format file describing one or more binary masks that together define the integrated circuit and are validated against design rules 140 for a specific manufacturing system 115.

At operation 203, the computer system segments layout 210, defining multiple different patches 215. Each patch 215 describes a discrete portion of layout 210. Patches 215 can be defined at multiple levels of granularity, corresponding to different characteristic length scales. For example, fine patches can be defined at length scales at which design rules 140 address geometrical limitations. In another example, coarse patches can be defined at length scales at which design rules 140 address process limitations. In this way, transformations can be prepared using multiple levels of granularity of patches 215. Segmentation may apply different approaches to defining patches 215. In one example, patches 215 describe different physical regions of the integrated circuit represented by layout 210. In another example, patches 215 describe different physical implementations of logical functions described by layout 210 and implemented by the integrated circuit. In some embodiments, layout 210 includes repeated implementations of basic logical functions, such that a set of patches 215 are repeated multiple times in the layout. Advantageously, a local correction 220 generated to correct one such patch 215 may be applied to other identical patches 215, reducing the computational resource demand of example process 200.

At operation 205, patches 215 are checked against design rules 140. In some embodiments, design rules 140 include both local constraints and global constraints. Examples of local constraints include, but are not limited to, one-layer rules and two-layer rules. One-layer rules, for example, include width rules that specify a minimum width of polygons 211 in the layout 210. In another example, spacing rules specify a minimum distance between two adjacent polygons 211. A two-layer rule, by contrast, specifies a relationship between two layers. For example, an enclosure rule specifies that an object of one type, such as a contact or via, be covered by a metal layer of a minimum thickness. As would be understood by a person having ordinary skill in the art, the nominal values for widths, spacings, and thicknesses are steadily decreasing as fabrication technology advances toward sub-nanometer process nodes. With improved fabrication technology, therefore, design rules 140 impose increasingly more precise limitations on patches 215. In addition, it is understood that other design rules 140 are contemplated as part of example process 200. As previously described, design rules 140 generally specify geometric and/or connectivity restrictions on layout 210 to account for variability in semiconductor manufacturing processes, resolution limits of optical processes, and to preserve the functionality of the integrated circuit.

As part of operation 205, the computer system identifies one or more non-compliant patches 220 from patches 215. Non-compliant patches 220 violate at least one design rule 140 governing the manufacture of the integrated circuit. Identification of non-compliant patches may be implemented using database files directly (e.g., GDSII, OASIS-formatted layout files), but may also be implemented using other file formats that are specific to design rule checking (DRC) software for automated (e.g., without human involvement) validation of layouts. In some embodiments, trained model 145 is trained to classify non-compliant patches 220. In an illustrative example, training the includes using a design rule checking engine provided with design rules 140, for example, in the form of a DRC rule file specifying the manufacturer supplied design rules in machine readable language. The DRC checking engine can read the GDSII file and the DRC rule file and report compliance of the design rules on the GDSII file. The output of the DRC checking engine can be used in training. Example process 200 is illustrated with four non-compliant patches 220, but it is understood that the number may vary between designs, such that example process 200 may include generating "N" local transformations 225, where "N" represents a positive integer.

In some embodiments, trained model 145 is a convolutional neural network model, trained to input an image 221 of a non-compliant patch 220 and to output transformation 225 predicted to transform non-compliant patch 220 into a compliant patch that is in compliance with design rules 140. In this context, the term "transformation" describes a value, sequence of values, such as a vector, or matrix of values, that can be combined with layout 210 to generate transformed layout 235. In an illustrative example, transformation 225 can be a vector of scalar values that identifies a polygon 211 of non-compliant patch 220, an edge and/or vertex of polygon 211, and an extent of transformation 225 by which the edge and/or vertex is modified. In this way, transformation can describe a modification of layout 210 to generate transformed layout 235 as an operator that can be applied to a numerical representation of layout 210.

It is understood that multiple machine learning model architectures are capable of taking in an image and outputting a vector of numerical values, of which the convolutional neural network is an example. In some embodiments, trained model 145 includes a transformer model, configured to receive images or image-type inputs, such as, for example, a vision transformer model. As an alternative to image-formatted inputs, model inputs can include vectors of coordinates describing vertices and/or edges corresponding to mask layouts. As such, a layout can be specified as vectors containing polygon 211 coordinates.

With vector-based inputs, trained model 145 can be or include, but is not limited to, encoder models; trained to generate an output vector in such a way that reflects input symmetries, for example, by being order-invariant with respect to the order of polygons 211 in the input vector. In some embodiments, trained model 145 can be or include one or more Graph Neural Networks (GNNs). In operation, a GNN can use one edge type to connect corners of the same polygon, another edge type to encode polygons in the same layer, and a third to encode layers in the same layout. In this way, a GNN can be used to generate transformations 225 at one or more bevels of granularity of patches 210.

To facilitate inputting non-compliant patches 220 to trained model 145, operation 205 includes generating an image 211 for each non-compliant patch 220. In some embodiments, each image 221 is a binary image representing polygons 211 as true and the background as false.

Trained model 145 generates transformation 225 by predicting one or more displacements or other modifications applied to one or more polygons 211 of non-compliant patch 221 that satisfies design rules 140 and preserves functional consistency with layout 210. In some embodiments, trained machine learning model 145 generates transformation 225 describing a displacement of an edge of a single polygon 211, where the non-compliant patch 220 may include one or more polygons 211. In some embodiments, transformation 225 describes a displacement of multiple edges corresponding to one or more polygons 211 in non-compliant patch 220. In this context, the term "displacement" refers to a translation, rotation, or other modification applied to an edge. For example, displacements may affect the dimensions and/or the position of polygons 211. In some embodiments, transformation 225 describes adding a vertex to an edge, resizing a polygon 211, increasing or decreasing a number of edges in a polygon 211, breaking apart an edge of a polygon 211. Preservation of functional consistency may be learned as part of training, as described in more detail in reference to FIG. 5.

In some embodiments, transformations 225 are generated by trained machine learning model 145 as vectors from an output layer of trained machine learning model 145. For example, where trained machine learning model 145 is a deep convolutional network, the model may include an input layer, an output layer, and one or more hidden layers. It would be understood by a person having ordinary skill in the art that the number of layers, the number of neurons, whether the model is fully connected, as well as other aspects of model architecture, could be modified as part of developing machine learning models 145-150. In addition, trained models 145 could incorporate hyperparameters as part of the model architecture, the tuning of which could form a part of training untrained machine learning models 150 to generate transformations 225 according to a particular set of design rules 140.

In some embodiments, transformation 225 can be described by a coordinate vector that can describe a layer of the first layout affected by the respective transformation 225, a location of the respective transformation 225 in the layer, an extent of the respective transformation 225, an edge of a polygon 211 of the respective non-compliant patch 225 (where the respective transformation represents a displacement of the edge), or combinations thereof. In some embodiments, coordinate vectors describe transformations 225 relative to respective non-compliant patches 220. Advantageously, the approach to generate coordinate vectors relative to layout 210, rather than generating a complete output image, for example, reduces the size of coordinate vectors, which may in turn reduce computational resource demand of operation 205 and facilitates subsequent operations of example process 200 involving combination of multiple coordinate vectors to generate transformed layout 235.

In some embodiments, multiple transformations 225 are generated as part of example process 200. For example, where layout 210 includes multiple non-compliant patches 220, operation 205 may result in multiple transformations 225 applied to multiple non-compliant patches 225. In some cases, however, transformations 225 that bring individual non-compliant patches 220 into compliance with design rules 140 may be mutually incompatible. Transformations 225 may be mutually incompatible where the transformations to each respective polygon 211 result in a new violation of design rules 140. In an illustrative example, a first polygon 211 in a first non-compliant patch 220 violates a width rule by being too narrow and a second polygon 211 in a second, different non-compliant patch 220 violates a spacing rule by being too close to another polygon in the second non-compliant patch 220. Individually, each polygon 211 may be transformed simply by transforming one or more edges to address the relevant design rule. When applied together, however, the first polygon and the second polygon are too close to each other and violate the spacing rule. Transformations 225 may also be mutually incompatible where the modification to each respective polygon 211 result in functional inconsistency between layout 210 and transformed layout 235.

As such, example process 200 can include generating a global transformation 230 from the transformations 225 at operation 207. Where layout 210 includes a single non-compliant patch 220, the global transformation 230 is the respective coordinate vector corresponding to the transformation 225, and operation 207 includes identifying the coordinate vector for the respective transformation 225 with global transformation 230. Where operation 205 includes generating multiple transformations 225 by trained machine learning models 145, operation 207 includes approaches for combination of the individual transformations 225 to generate global transformation 230. For example, global transformation 230 may incorporate each transformation 225 or may incorporate a subset of the transformations 225.

In some embodiments, operation 207 includes a fixed-algorithm approach, such as a rules-based model 231, an object model, or other technique to select a subset of transformations 225 to incorporate into global transformation 230. For example, rules-based model 231 may include a subset of design rules 140 as part of a validation check to identify any mutually incompatible transformations 225. In some embodiments, rules-based model 231 also validates transformations 225 against global design rules 140 that impose constraints on the layout-level rather than on a local patch-level. For example, global design rules 140 can include, but are not limited to, area constraints on a layout.

Additionally or alternatively, rules-based model 231 may validate functional consistency after transformations 225 are implemented, individually and/or collectively. In some embodiments, validation of functional consistency on the patch level includes simulating operations of the components represented in patches 211 before and after transformations 225 are applied, and comparing the resulting simulation results. In this way, rules-based model 231 may select the transformations 225 to use when generating global transformation 230.

For example, where patches 211 represent discrete functional units of layout 210, simulations included in rules-based model 231 may include physical simulation of the functional units. In some embodiments, validation includes physical simulations of electromagnetic properties of patches 211, as an approach to simulate interference effects between proximal polygons 211. For example, where a first polygon 211 represents a conductor that generates an electric field, and where a proximal second polygon 211 represents a circuit element that capacitively cross-couples to a proximal second polygon 211 representing another circuit element. In this way, validation for functional consistency as part of rules-based model 231 may include design rules 140 and other rules including, but not limited to, physical rules corresponding to metainformation describing functional aspects of patches 210.

In some embodiments, operation 207 includes selecting transformations for use when generating global transformation 230 by approaches that focus on the overall outcome of design rule 140 checking of an intermediate layout. For example, transformations 225 may be pooled and selected by techniques including, simple majority vote, loopy belief propagation, or other software-implemented decision-making protocols. Such approaches may be iterative, including multiple cycles of iteration to determine whether an individual transformation 225 impacts the outcome of design rule 140 checking and affects functional consistency.

At operation 209, the computer system generates transformed layout 235 by applying global transformation 230 to layout 210. As global transformation 230 describes one or more transformations 225 relative to layout 210, transformed layout 235 is generated by transforming one or more polygons 211 in layout 210. As previously described, transformations can include, but are not limited to displacement, shrinkage, elongation, or changing the number of vertices of a polygon 211. In this way, transformed layout 235 satisfies design rules 140 and preserves functionality of layout 210.

Figure 3:
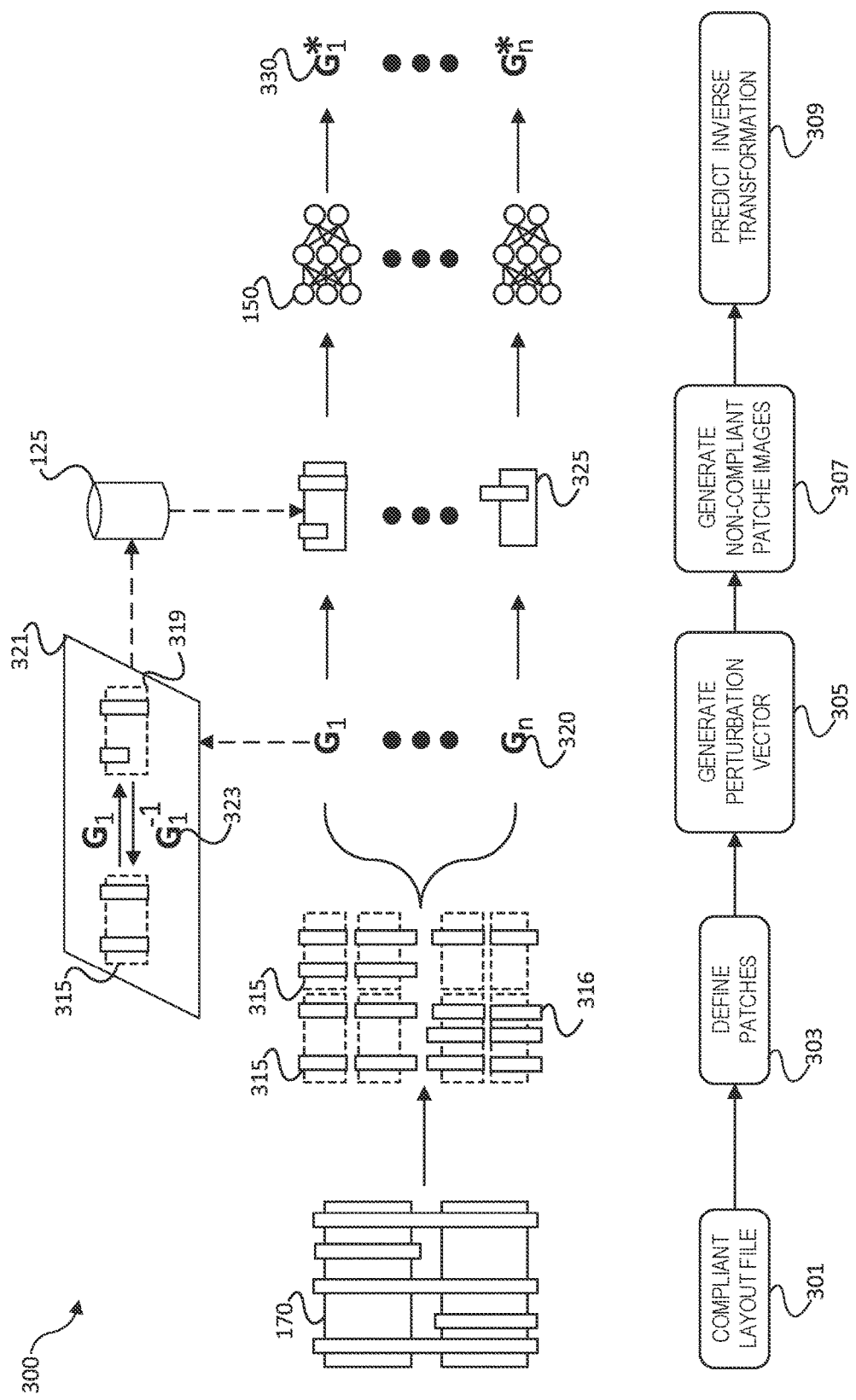
FIG. 3 is a schematic diagram illustrating an example process for training a machine learning model to generate compliant second layouts, in accordance with embodiments of the disclosure.

FIG. 3 is a schematic diagram illustrating an example process 300 for training a machine learning model to generate second layouts 235, in accordance with embodiments of the disclosure. Example process 300 may be implemented by one or more constituent elements of example system 100 of FIG. 1 as computer-implemented processes, including but not limited to server(s) 105 and/or client computing device(s) 110. Example process 300 includes operations 301-309 for accessing and/or receiving a second layout file 170, defining compliant patches 315, generating one or more perturbation vectors 320, generating perturbed patches 325, and predicting inverse transformations 330.

As previously described, example system 100 includes trained model(s) 145, developed for design rules 140 from untrained model(s) 150. It is understood that training techniques differ for different model architectures, including supervised, semi-supervised, unsupervised, or other approaches. Description of example process 300 focuses on supervised training using labeled training data, but it is understood that other approaches may be used that are appropriate for model architectures, should the models 145-150 incorporate additional and/or alternative architectures.

Example process 300 is illustrated as a series of operations 301-309 implemented by a computer system, but it is understood that one or more of the operations 301-309 may be omitted, reordered, or divided. For example, in some embodiments, operations 301-307 are implemented by a separate process of data preparation from operations 309 involving training of untrained model(s) 150, as described in more detail in reference to FIG. 6. In some embodiments, example process 300 can be implemented as part of an interactive design environment, whereby a human user of the computer system can interact with design rules 140, training data 130, untrained models 150, and/or layout files 170 during development of trained models 145.

At operation 301, the example process 300 includes accessing and/or receiving layout file 170. Layout file 170 is an integrated circuit layout file that describes an integrated circuit in compliance with one or more sets of design rules 140. In the context of example system 100, accessing and/or receiving may include, but is not limited to, operations for accessing layout file 170 from third database 165, receiving layout file 170 from client computing device(s) 110, or receiving layout file 170 from manufacturing system(s) 115, for example, where untrained models 150 are being trained for compatibility with design rules 140 for manufacturing system(s) 115 using layout files 170 provided directly by manufacturing system(s) 115. It is contemplated that example process 300 can generate training data with or without original design files provided by manufacturing system(s) 115, for example, by using relevant design rules 140 to train untrained models 150.

At operation 303, example process 300 includes defining compliant patches 315 using layout file 170. As in FIG. 2, compliant patches 315 may be defined such that they describe discrete portion regions of a layout. The discrete portions, in turn, may correspond to physical regions of the integrated circuit, such as an area of a layer of the layout. Alternatively, the discrete portions may correspond to physical implementations of logical functions described by the layout, as implemented by the integrated circuit. For example, where compliant patches 315 describe combinations of logic gates that are electronically coupled to provide a particular functionality, the individual logic gates may be physically separated in the integrated circuit. In some embodiments, compliant patches 315 represent design elements as polygons 316 defined by one or more edges, at which transformations may be addressed.

As part of an approach to generating training data for model training, example process 300 may optionally include generating design pairs 321 from second layout files 170. In this context, design pairs 321 refers to a discrete set of training data including a compliant patch 315, a non-compliant patch 319, and a perturbation vector 320 describing a perturbation of the compliant patch 315 producing the non-compliant patch 319. Perturbation vector 320 is functionally analogous to transformations 225 of FIG. 2 but is referred to as a perturbation vector to emphasize that the perturbation vector produces non-compliant patch 319 according to a specific set of design rules 140 (e.g., puts compliant patch 315 out of compliance with the specific design rules 140). In some embodiments, data representing design pairs 321 also includes inverse perturbation vectors 323 that are defined as the transformation producing compliant patch 315 from non-compliant patch 319. As part of operation 305, defining inverse perturbation vector 323 includes vector operations to directly determine the inverse of perturbation vector 320. In some embodiments, more than one inverse perturbation vector 323 can describe a transformation producing compliant patch 315 from non-compliant patch 319. Detailed description of perturbation is provided in reference to FIGS. 4-5.

Example process 300 may optionally include storing design pairs 321 in first database 125 as training data 130. In this way, example process 300 may be implemented as parallel processes, where generating design pairs 321 is separated from training untrained model(s) 150. For example, example process 300 may optionally separate between operation 305 and operation 307 and may include accessing training sets of design pairs 321 from first database 125.

At operation 307, example process 300 includes generating images 325 of non-compliant patches 319 (also referred to as "non-compliant images"), as described in more detail in reference to images 221 of FIG. 2. In contrast to example process 200, however, non-compliant images 325 are synthesized from perturbation of compliant patches 315, rather than being generated from layout 210. Similarly, non-compliant images include polygons 316, at least one of which violates a particular set of design rules 140. Training untrained model 150 using non-compliant images 325 allows for prediction of transformations 225 for the particular set of design rules 140.

At operation 309, non-compliant images 325 are inputted to untrained model 150. As described in reference to FIG. 2, untrained model 150 includes a convolutional neural network model, incorporating input and output layers and one or more hidden layers. As would be understood by a person having ordinary skill in the art, untrained model 150 may be fully connected or not fully connected, may include hidden layer structure (e.g., depth, number of neurons, connectedness, etc.) selected to best predict the inverse perturbation vector 323 without overfitting.

Operation 309 includes generating inverse transformations 330 using untrained model 150. Untrained model 150 generates inverse transformations 330 as output coordinate vectors, as described in more detail in reference to FIG. 2, describing transformations applicable to non-compliant patches 319 to produce compliant patches 315. The outputs of untrained model 150 are referred to as inverse transformations 330 to emphasize the relationship between non-compliant patches 319 and compliant patches 315, described by perturbation vector 320, the prediction of which is part of supervised training of untrained model 150.

Data generated as part of example process 300, including design pairs 321, inverse transformations 330, and/or non-compliant images 325, may be stored in one or more data stores, as part of parallel and/or distributed computing processes, as such, while the operations of example process are illustrated as discrete and serial sub-processes, it is contemplated that one or more of operations 301-309 may be implemented in parallel on multiple processors that may be physically separated into different physical systems.

Figure 4:
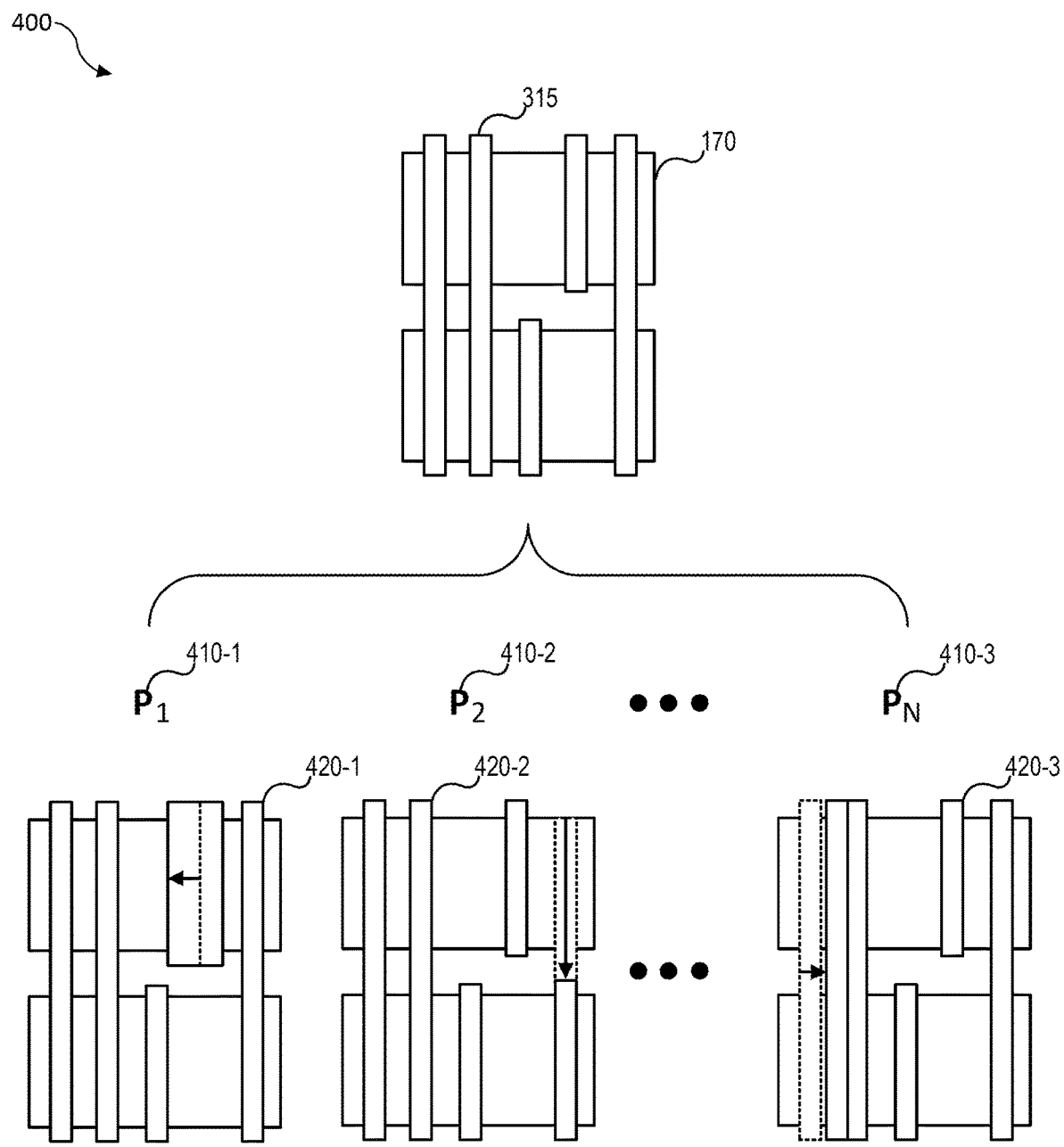
FIG. 4 is a schematic diagram illustrating an example technique for generating labeled training data from layout files, in accordance with embodiments of the disclosure.

FIG. 4 is a schematic diagram illustrating an example technique 400 for generating labeled training data from layout files 170, in accordance with embodiments of the disclosure. Example technique 400 describes computer-implemented processes permitting a relatively sparse set of second layout files 170 to be used to generate training data 130. Example technique 400 includes defining multiple perturbation vectors 410, as described in reference to FIG. 3, as an approach to generating multiple different second layouts 420, for use in training untrained model(s) 150.

Example technique 400 is illustrated on a layout-level but may similarly be applied on a patch-level, at least in part because perturbations 410 may each describe a displacement of one edge in one polygon 315 in transformed layout 235, a displacement of multiple edges in a polygon 315, a displacement of a polygon 315, resizing a polygon 315, dividing a polygon 315, adding one or vertices to a polygon 315, or a combination thereof. In some embodiments, perturbations 410 may describe transformations applied to multiple polygons 315. Polygons 315, while illustrated as rectangles, can include 3 or more vertices. Advantageously, implementing example technique 400 on a patch-level, as illustrated in FIG. 3, reduces the risk of overfitting during model training, as described in more detail in reference to FIG. 5, by increasing the number of perturbations 410 for a given number of available layout files 170, while also reducing the computational resource demand associated with processing and storing entire layout files 170 for which a single edge in a single polygon 315 is transformed.

As illustrated in FIG. 4, a first perturbation 410-1 displaces one edge of one polygon 315 to increase the size of the polygon 315 and generate a first second layout 420-1. A second perturbation 410-2 displaces an edge of a different polygon 315 to generate a second second layout 420-2. A third perturbation 410-3, illustrated as the last of "N"

perturbations 410, where "N" is a positive integer, displaces an entire polygon 315 to generate a third second layout 420-3.

As part of example technique 400, perturbations 410 may implement a distribution of design rule 140 violations that substantially reproduce that observed in first layouts 210 received from designers (e.g., via client computing device(s) 110 of FIG. 1). The number of perturbations 410, represented by "N," therefore is large enough to include examples of violations observed in first layouts 210, but also concentrated enough to avoid biasing training data 130 with design pairs 321 that do not reproduce meaningful violations.

In some embodiments, perturbations 410 are limited to generate second layouts 420 that represent meaningful training data 130, for example, by including validation of functional consistency between the layout file 170 and the second layouts 420. Functionality validation may form a sub-process of example technique 400, as part of data preparation for model 150 training. In an illustrative example, perturbation 410 may generate N second layouts 420, while a separate process may validate each of the N layouts and selectively remove second layouts 420 that are not functionally consistent with first layout 170. Advantageously, quality control for training data 130 improves accuracy and performance of trained models 145 and reduces the time and computational resource demand for training of model(s) 145-150. Where patches 210 are defined at a level of granularity that does not permit validation of full logical functionality, quality control for training data 130 can include checking whether a perturbation 410 forms or breaks connections in a patch 210.

Figure 5:
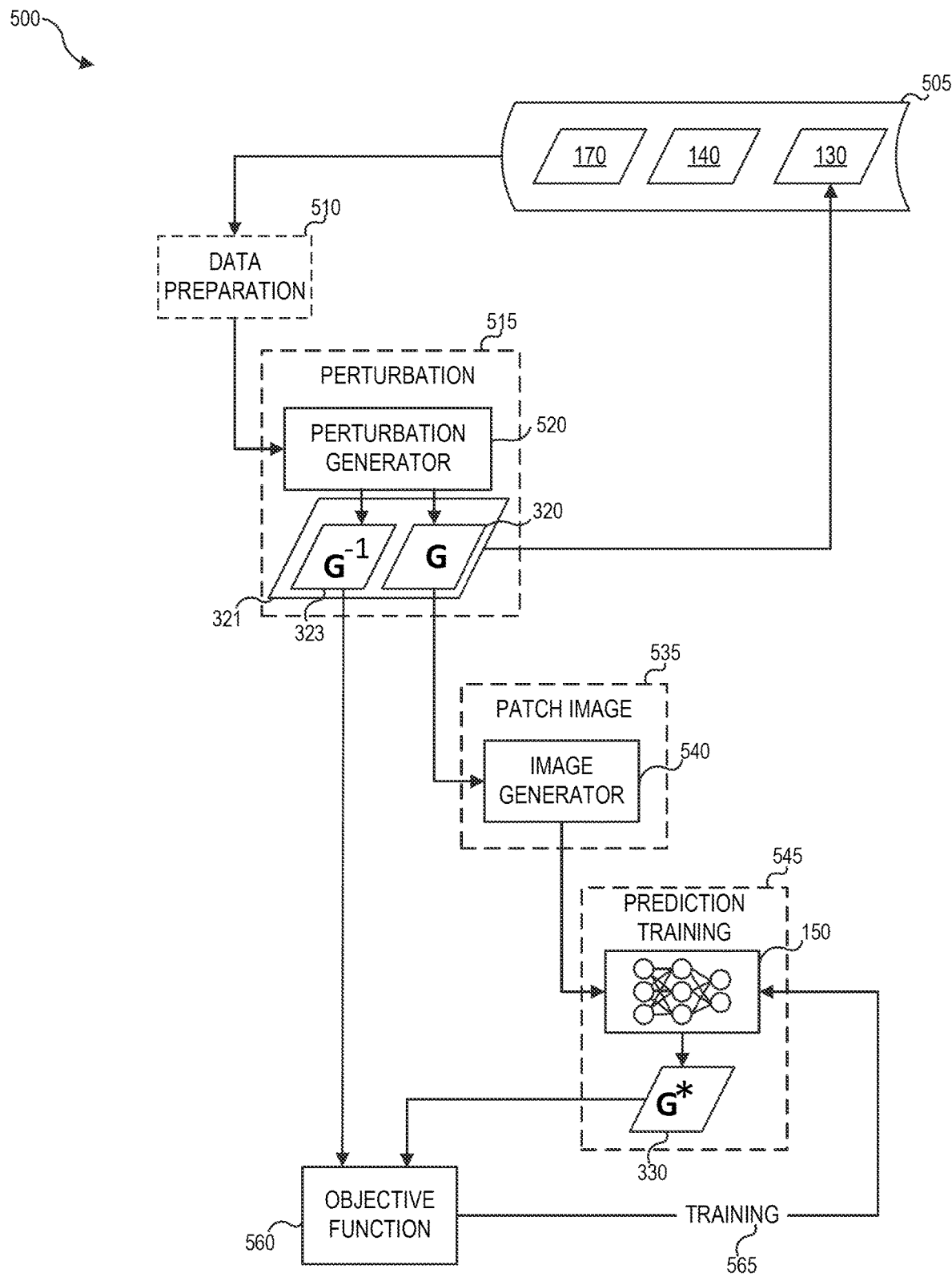
FIG. 5 is a block flow diagram illustrating data flows in an example process for training a machine learning model to generate compliant second layouts, in accordance with embodiments of the disclosure.

FIG. 5 is block flow diagram illustrating data flows in an example process 500 for training a machine learning model 150 to generate second layouts, in accordance with embodiments of the disclosure. Example process 500 is implemented by one or more computer systems, such as server(s) 105 and/or client computing device(s) 110 of FIG. 1 and includes process blocks that describe constituent operations of example processes 200-400 of FIGS. 3-4. In this way, example process 500 focuses on data flows involved in training operations. The constituent process blocks making up example process 500 include: data storage 505, data preparation 510, perturbation 515, image generation 535, and prediction training 545. Blocks also include perturbation generator 520, image generator 540, and objective function 560.

Data storage 505 includes training data 130, design rule data 140, and layout files 170 and is an example of databases 125, 135, and 165. As described in reference to FIG. 1, data storage may be implemented as physical storage, distributed storage, or a combination thereof.

Data preparation 510 implements operations on layout files 170 to define compliant patches 315, as described in more detail in reference to FIGS. 2-3. For example, data preparation may include segmentation based on logical function, based on a predetermined size of a patch, or a combination thereof. Layout files 170 include publicly available second layouts and may include proprietary layout files 170 prepared or provided from foundries and stored in data storage 505.

In some embodiments, data preparation 510 also includes input/output operations to access layout files 170 from data storage 505, for example, as part of automated (e.g., without human involvement) generation of training data 130. To that end, layout files 170, design rules 140, and/or training data 130 may be labeled by metadata permitting computer systems to identify layout files 170 that are compliant with a particular set of design rules 140 and to identify training data 130 with layout files 170 and/or design rules 140. While types of design rules 140 may be consistent between manufacturing systems 115, variability between different sets of design rules 140 is significant, such that training data for a given set of design rules 140 is likely to be ineffective for a different set of design rules 140. Similarly, types of layout files 170 may vary between different manufacturing systems 115, for example, where the integrated circuits described include different materials and/or different structures, such that some design rules 140 may be inapplicable for some layout files 170. Advantageously, associating training data 130, design rules 140, and layout files 170 may improve overall system performance, for example through database structure optimization and reduction of overall data volume, by accessing appropriate layout files 170 corresponding to particular design rules 140, and generating meaningful training data 130.

Perturbation 515, as described in reference to FIGS. 3-4, includes generating transformations represented by perturbation vectors 320 and inverse perturbation vectors 323 as part of design pair 321. Generator 520 may also implement operations for quality control, such as functional consistency between transformed layout 235 and second layouts 420. On a patch-wise basis, generator 520 may implement an algorithm including one or more sub-tasks. For example, sub-tasks may include but are not limited to determining whether to perturb a given patch, determining where and how to perturb the patch, and generating perturbation vector 320. Determining whether to perturb the patch may include cross-referencing the patch with design pairs 321 already stored in data storage 505. Since patches may be defined to represent repeatable units that appear many times in transformed layout 235, perturbation generator 520 may determine that perturbation 515 of a given patch is duplicative. Advantageously, such an approach reduces overall computational resource demand of perturbation 515 by reducing the number of patches treated to generate a representative training set of design pairs 321.

Determining the perturbation may include determining a layer, edge, location, and extent of the perturbation. As described in more detail in reference to FIG. 2, each patch may be described with metainformation that relates the patch to transformed layout 235 from which it was generated. Metainformation can include references to a layer of a multilayer layout, a polygon in the patch, an edge of the polygon, and/or location indicators or coordinates of objects described as part of the patch, for example, using a cartesian coordinate system. It is understood that multiple different approaches can be adopted to describe patches in the context of transformed layout 235 and to describe polygons/edges in the context of a given patch. Advantageously, appending patch data with metadata may improve performance of example system 100 of FIG. 1 at least in part by reducing the volume of training data generated and/or reducing quality control tasks and data selection for training data 130.

The extent of a perturbation refers to the transformation applied to one or more edges, polygons, or other features of a given patch. For example, the extent may describe, but is not limited to, a number of pixels to displace an edge or a polygon, a distance to displace an edge or a polygon, or a resize operation applied to a polygon. The extent may be described in reference to the patch, which is in turn related to transformed layout 235 through metainformation. Generator 520 outputs perturbation vector 320 describing the extent of the perturbation applied to the patch. Perturbation vector 320 can be formatted to be compatible with the file format used to describe transformed layout 235 (e.g., GDSII, OASIS, etc.). In some embodiments, generator 520 also outputs inverse perturbation vector 323 for use in training untrained model 150.

Image generation 535 describes one or more operations for generating an image of a non-compliant patch using layout file 170 data and perturbation vector 320, as described in more detail in reference to FIG. 3. Image generator 540 can be or include algorithms in software for receiving a layout file or other data format describing a given compliant patch, receiving the corresponding perturbation vector 320, and generating an image describing the perturbed patch for use in training untrained model 150. Image generation can include generating a binary mask, where polygons are represented as true values and background as false values. Image generator 540 can determine the size, location, and orientation of polygons in the image by combination of perturbation vector 320 with transformed layout 235.

Once generated, image data is passed to prediction training 545. Prediction training 545 includes inputting image data describing a given non-compliant patch to untrained model 150, outputting predicted inverse transformation 330, and receiving a training signal 565 from objective function 560. As described in more detail in reference to FIG. 3, untrained model 150 is configured to input an image and to output a correction vector formatted for a given integrated circuit layout format. As with perturbation vector 320 and inverse perturbation vector 323, predicted inverse transformation 330 describes a transformation to one or more polygons in the image generated by image generator 540, which is made in reference to the transformed compliant patch output by perturbation 515. Untrained model 150 predicts a transformation of a non-compliant patch into a compliant patch, based on a given set of design rules 140.

Prediction training 545 outputs inverse transformation 330 to objective function 560. Objective function 560 describes a loss function or other optimization algorithm that receives as inputs inverse perturbation vector 323 and inverse transformation 330. The inputs are compared, for example, by determining a difference between the two input vectors. The comparison can be used as a basis for generating training signal 565. It is understood that multiple different approaches can be used to train machine learning models, some of which are better suited for particular architectures, while others are better suited for different architectures. Advantageously, perturbation approaches described in reference to FIGS. 3-5 generate labeled training data 130, thereby facilitating supervised learning techniques that can be paired with rules-based models using design rules 140 to label training data 130, for example, as part of automated (e.g., without human involvement) software to generate and store training data 130.

Multiple training signals 565 can be generated for a volume of training data 130, such that untrained model 150 learns one or more parameters. Over a number of training intervals, untrained model 150 can converge to a set of learned parameters that permit precise and accurate prediction of inverse perturbation vector 323. At such time, untrained model 150 can be considered to be trained, and can be deployed, as described in more detail in reference to FIG. 2. It is understood that design rules, layout files 170, and other factors may change over time, which may motivate retraining of trained models 145. In this way, untrained model 150, described in the context of example process 500 as being trained for the first time, can also represent a previously trained model 145 that is retrained for an update to design rules 140 or with new training data.

Figure 6:
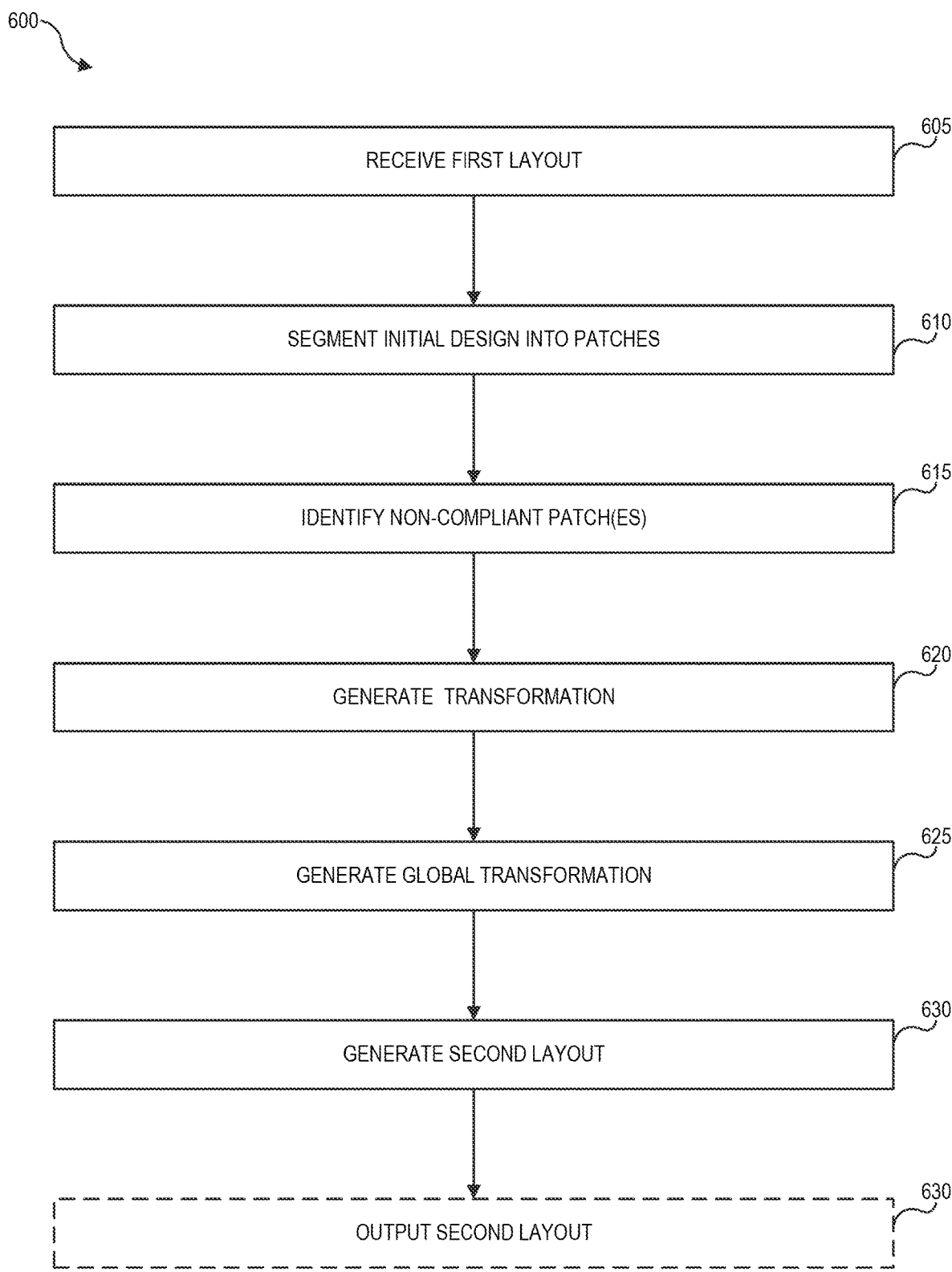
FIG. 6 is a block flow diagram of an example process for generating functionally consistent and manufacturable integrated circuit layouts in compliance with semiconductor manufacturing system design rules, in accordance with embodiments of the disclosure.

FIG. 6 is a block flow diagram of an example process 600 for generating functionally consistent and manufacturable integrated circuit layouts in compliance with semiconductor manufacturing system design rules 140, in accordance with embodiments of the disclosure. Example process 600 describes an example of operations implemented by a computer system (e.g., server(s) 105 of FIG. 1) as part of deploying trained model(s) 145, as described in more detail in reference to example process 200 of FIG. 2. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

At block 605, the computer system receives layout 210 describing an integrated circuit. Layout 210 may be received from client computing device 110 over network 120, or can be retrieved from storage, such as third database 165 storing layout files 170. Layout 210 can be formatted as an integrated circuit layout file, as is typically used during integrated design and validation of layouts against design rules 140 for a given semiconductor manufacturing system 115. Layout 210 describes masks that are used to pattern photoresist. The photoresist is used during processing of semiconductor wafer to define regions of conductors, semiconductors, refractory materials, or other materials that are deposited or removed as part of manufacturing an integrated circuit. Masks can be binary masks, describing each type of removal or deposition separately.

At block 610, the computer system segments layout 210 into compliant patches 215. Segmentation can define different patches for each layer of layout 210. In an illustrative example, a layout for metal wires connecting to a field effect transistor may include information describing both conductor and dielectric materials. Each respective layer of a layout, described by different masks, can be constrained by a different set of design rules 140, such that different trained models 150 are prepared for different layers of a layout file that describe different masks, and segmentation at block 610 proceeds by defining different patches for different layers of layout 210. Additionally or alternatively, a trained model 145 can be trained with one set or subset of design rules 140 and another trained model 145 can be trained with a different set or subset of design rules 140, with which the transformed layout 235 through implementation of a pooling and/or voting scheme. As layout 210 may include multiple layers, patches can be labeled with metainformation to track position within a layer and to identify the layer from which each patch originates. Similarly, metainformation may be generated to identify polygons, edges, and locations in each patch. Such metainformation facilitates generation of coordinate vector(s) 230 during deployment of trained models 145, such as through rules-based model(s) 231.

Subsequent defining patches, the computer system identifies non-compliant patch(es) at block 615. Identifying non-compliant patches includes selecting, receiving, or accessing relevant design rules 140 and validating non-compliant patches against the relevant design rules 140, for example, using a design rule checking engine configured to receive a layout file and to generate Boolean outputs such as "compliant" and "non-compliant," "true" and "false," or the like. As described in more detail in reference to FIGS. 2-4, validation can include, but is not limited to, local design rule checking for polygon size, spacing, position, or combinations thereof as part of one-layer rules and/or two-layer rules. Identifying non-compliant patch(es) in this way also may include storing identifier information and/or patch data in a temporary system to be passed to image generation and prediction subsystems, as described in more detail in reference to FIG. 2.

At block 620, the computer system generates a transformation 225 for each non-compliant patch 220, each respective transformation 225 being predicted to transform a non-compliant patch 220 into a compliant patch that is in compliance with design rules 140. As described in more detail in reference to FIGS. 1-2, generating transformations 225 includes generating images 221 of non-compliant patches 220 and inputting images 221 to trained model(s) 145 that are trained to output transformations 225 each non-compliant patch 220. In some embodiments, a single trained model 145 is used for images 221. In some embodiments, multiple trained models 145 are used for different subsets of design rules 140.

At block 625, the computer system generates output coordinate vector 230 that describes the transformation of first layout 201 to transformed layout 235. The output coordinate vector 230 includes at least a subset of transformations 225, and describes layer, edge, location, and extent information for applying each transformation to first layout, such as in terms of polygons 211. Generating output coordinate vector 230 can include one or more rules-based models 231 or other fixed-algorithms that are configured to select a subset of transformations 225 for inclusion in output coordinate vector 230. As described in more detail in reference to FIG. 2, rules-based methods can include algorithmic decision-making routines as well as physical simulation to validate output coordinate vector 230 against design rules 140, including global design rules on the layout-level, as well as to validate functional consistency between layout 210 and transformed layout 235.

At block 630, the computer system generates transformed layout 235. Generating transformed layout 235 can include applying output coordinate vector 230 to layout 210, such that the transformations 225 included in output coordinate vector 230 are implemented. In this way, polygons 211 of layout 210 that violated design rules 140 are transformed (e.g., displaced, resized, etc.) according to the output of trained model(s) 145. In some embodiments, generating transformed layout 235 includes validation of second layout against design rules 140 and for functional consistency with layout 210. For example, one or more operations may be simulated using layout 210 and using transformed layout 235, and the resulting outputs can be compared for functional consistency. Where transformed layout 235 fails to satisfy design rules 140 or does not preserve functional consistency, example process 600 may include iterating one or more process blocks and may generate a new transformed layout 235.

In some embodiments, example process 600 includes outputting transformed layout 235. Outputting operations include, but are not limited to, storing transformed layout 235 in data storage, such as third database 165 as layout file 170. In some embodiments, output operations can be implemented as part of an interactive design environment, whereby a human user of the computer system can be presented with transformations to designs during development of layout 210. This can include an integration of trained model 145 output into a user interface environment used to develop designs. For example, output can include presenting transformed layout 235 on a display of a computer system (e.g., client computing device 110 of FIG. 1). Output operations can also include outputting transformed layout 235 to semiconductor manufacturing system(s) 115, as described in more detail in reference to FIG. 1. Semiconductor manufacturing system(s) 115 may be implement intermediary processes between tapeout and manufacture a compliant integrated circuit in accordance with transformed layout 235, such as inverse lithography.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A computer implemented method for generating integrated circuit layouts, the computer implemented method comprising:
    receiving a first layout for an integrated circuit;
    segmenting the first layout into a plurality of different patches, each patch of the plurality of patches describing a discrete portion of the first layout;
    identifying a non-compliant patch of the plurality of patches, the non-compliant patch violating a design rule governing the manufacture of the integrated circuit;
    using a machine learning model to output a transformation of the non-compliant patch, wherein the transformation describes a modification of the first layout; and
    generating a second layout using the transformation and the first layout, wherein the second layout is compliant with the design rule.

2. The computer implemented method of claim 1, wherein the non-compliant patch is a first patch, the transformation is a first transformation, the design rule is a first design rule, and wherein the computer implemented method further comprises:
    identifying a second patch of the plurality of patches, the second patch violating a second design rule governing the manufacture of the integrated circuit, wherein the second patch is different from the first patch;

using the machine learning model to output a second transformation of the second patch; and
generating a global transformation using the first transformation and the second transformation,
wherein generating the second layout comprises modifying the first layout using the global transformation.

3. The computer implemented method of claim 2, wherein generating the global transformation comprises:
inputting the first transformation and the second transformation into a rules-based model configured to preserve a function of the integrated circuit;
selecting, by the rules-based model, to include the first transformation, the second transformation, or both the first transformation and the second transformation in the global transformation; and
generating the global transformation using the rules-based model.

4. The computer implemented method of claim 1, wherein the non-compliant patch defines a plurality of polygons, and wherein the transformation describes a modification of a polygon of the plurality of polygons relative to the first layout.

5. The computer implemented method of claim 4, wherein the transformation describes a displacement of an edge of the polygon, an introduction of a gap in the edge, or an introduction of a vertex in the edge.

6. The computer implemented method of claim 1, wherein the machine learning model is a convolutional neural network model, and wherein using the machine learning model to output the transformation comprises:
inputting an image of the non-compliant patch to the convolutional neural network model trained to predict the transformation from the image; and
predicting the transformation using the convolutional neural network model.

7. The computer implemented method of claim 1, further comprising training the machine learning model, the training comprising:
accessing a training set of design pairs, each design pair comprising a compliant patch, a non-compliant patch, and a perturbation vector describing a perturbation of the compliant patch producing the non-compliant patch;
inputting a non-compliant image of the non-compliant patch to the machine learning model;
predicting an inverse transformation using the machine learning model;
generating a training signal using the inverse transformation and the perturbation vector; and
modifying one or more learned parameters of the machine learning model using the training signal.

8. The computer implemented method of claim 7, further comprising:
receiving a second layout file associated with a set of design rules for an integrated circuit manufacturing process;
defining a plurality of compliant patches using the second layout file, each compliant patch of the plurality of compliant patches in compliance with the set of design rules;
generating a perturbed patch using a compliant patch of the plurality of compliant patches;
determining that the perturbed patch violates one or more design rules of the set of design rules;
defining the perturbation vector linking the compliant patch and the perturbed patch; and
generating a design pair of the set of design pairs using the compliant patch, the perturbed patch, and the perturbation vector.

9. The computer implemented method of claim 1, wherein the non-compliant patch describes a physical region of the integrated circuit.

10. The computer implemented method of claim 1, wherein the non-compliant patch describes a physical implementation of a logical function described by the first layout and implemented by the integrated circuit.

11. The computer implemented method of claim 1, wherein the transformation describes a layer of the integrated circuit affected by the transformation, a location of the transformation in the layer, and an extent of the transformation.

12. The computer implemented method of claim 11, wherein the transformation is addressed at an edge of a polygon of the non-compliant patch.

13. The computer implemented method of claim 1, wherein the first layout and second layout are functionally consistent.

14. The computer implemented method of claim 1, further comprising outputting the second layout to a display as part of an interactive design environment.

15. The computer implemented method of claim 1, wherein identifying the non-compliant patch comprises checking the plurality of patches against the design rule using a design rule checking engine.

16. At least one machine-accessible storage medium that provides instructions that, when executed by a machine, will cause the machine to perform operations comprising:
receiving a first layout for an integrated circuit;
segmenting the first layout into a plurality of different patches, each patch of the plurality of patches describing a discrete portion of the first layout;
identifying a non-compliant patch of the plurality of patches, the non-compliant patch violating a design rule governing the manufacture of the integrated circuit;
using a machine learning model to output a transformation of the non-compliant patch, wherein the transformation describes a modification of the first layout; and
generating a second layout using the transformation and the first layout, wherein the second layout is compliant with the design rule.

17. The at least one machine-accessible storage medium of claim 16, wherein the non-compliant patch is a first patch, the transformation is a first transformation, the design rule is a first design rule, and wherein the instructions, when executed by the machine, further cause the machine to perform operations comprising:
identifying a second patch of the plurality of patches, the second patch violating a second design rule governing the manufacture of the integrated circuit, wherein the second patch is different from the first patch;
using the machine learning model to output a second transformation of the second patch; and
generating a global transformation using the first transformation and the second transformation,
wherein generating the second layout comprises modifying the first layout using the global transformation.

18. The at least one machine-accessible storage medium of claim 17, wherein generating the global transformation comprises:
inputting the first transformation and the second transformation into a rules-based model configured to preserve a function of the integrated circuit;

selecting, by the rules-based model, to include the first transformation, the second transformation, or both the first transformation and the second transformation in the global transformation; and generating the global transformation as an output of the rules-based model.

19. The at least one machine-accessible storage medium of claim 16, wherein the non-compliant patch defines a plurality of polygons, and wherein the transformation describes a displacement of an edge of a polygon of the plurality of polygons, an introduction of a gap in the edge, or an introduction of a vertex in the edge.

20. The at least one machine-accessible storage medium of claim 16, wherein using the machine learning model to output the transformation comprises:

inputting an image of the non-compliant patch to a convolutional neural network model trained to predict the transformation from the image; and predicting the transformation using the convolutional neural network model.

* * * * *